(12) United States Patent
Chung et al.

(10) Patent No.: US 6,525,406 B1
(45) Date of Patent: Feb. 25, 2003

(54) SEMICONDUCTOR DEVICE HAVING INCREASED MOISTURE PATH AND INCREASED SOLDER JOINT STRENGTH

(75) Inventors: Young Suk Chung, Seoul (KR); Sung Sik Jang, Hanam-shi (KR); Jae Jin Lee, Seoul (KR); Tae Heon Lee, Kuri-shi (KR); Hyung Ju Lee, Seoul (KR); Jung Woo Lee, Seoul (KR); Mu Hwan Seo, Aspen Heights (SG); Jae Hak Yee, Singapore (SG); Ku Sun Hong, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,049

(22) Filed: Oct. 13, 2000

(30) Foreign Application Priority Data

| Oct. 15, 1999 | (KR) | 99-44645 |
| Oct. 15, 1999 | (KR) | 99-44647 |
| Oct. 15, 1999 | (KR) | 99-44648 |
| Oct. 15, 1999 | (KR) | 99-44649 |
| Oct. 15, 1999 | (KR) | 99-44652 |
| Oct. 15, 1999 | (KR) | 99-44654 |

(51) Int. Cl.$^7$ ............................................. H01L 23/495
(52) U.S. Cl. ........................ 257/666; 257/684; 257/730; 438/110; 438/123
(58) Field of Search ................................ 438/106, 110, 438/118, 120–123; 257/666, 687, 670, 676, 712, 730

(56) References Cited

U.S. PATENT DOCUMENTS 4,530,152 A    7/1985   Roche et al. ................. 29/588
5,041,902 A    8/1991   McShane ...................... 357/79
5,157,480 A   10/1992   McShane et al. ............. 357/74
5,172,213 A   12/1992   Zimmerman ................. 257/796
5,172,214 A   12/1992   Casto ........................... 257/676

(List continued on next page.)

FOREIGN PATENT DOCUMENTS

JP       57-45959      3/1982
JP      58-101317      6/1983

(List continued on next page.)

*Primary Examiner*—David Nelms
*Assistant Examiner*—Dung Anh Le
(74) *Attorney, Agent, or Firm*—Stentina Brunda Garred & Brucker

(57) ABSTRACT

Disclosed is a semiconductor package and a method for manufacturing the same. A planar or substantially planar die pad is disposed within a leadframe and is connected to the leadframe by a plurality of tie bars. An perimeter of an upper and lower surface of the die pad is half-etched to increase the moisture-permeation path of the finished package. A plurality of rectangular leads extends from the leadframe toward the die pad without contacting the die pad. A silver-plating layer may be formed on the upper surface of the leadframe. A semiconductor chip is mounted on the upper surface of the die pad in the leadframe. After deflashing, the package is treated with a sulfuric ($H_2SO_4$)-based solution to restore the internal leads to their original color. Prior to singulation, the externally exposed bottom surfaces of the leads are plated with copper, gold, solder, tin, nickel, palladium, or an alloy thereof to form a predetermined thickness of a plating layer. The singulation step comprises forming a burr at a peripheral side surface of the leads in the upward direction. The finished package may be marked with a recognition mark to enable a user to more easily identify the first lead.

43 Claims, 19 Drawing Sheets

U.S. PATENT DOCUMENTS

| | | | |
|---|---|---|---|
| 5,278,446 A | 1/1994 | Nagaraj et al. | 257/707 |
| 5,428,248 A | 6/1995 | Cha | 257/676 |
| 5,521,429 A | 5/1996 | Aono et al. | 257/676 |
| 5,701,034 A | 12/1997 | Marrs | 257/706 |
| 5,783,861 A | 7/1998 | Son | 253/693 |
| 5,835,988 A | 11/1998 | Ishii | 257/684 |
| 5,866,939 A | 2/1999 | Shin et al. | 257/666 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,143,981 A * | 11/2000 | Glenn | 174/52.4 |
| 6,225,146 B1 * | 5/2001 | Yamaguchi | 438/123 |
| 6,229,200 B1 * | 5/2001 | Mclellan et al. | 257/666 |
| 6,355,502 B1 | 3/2002 | Kang et al. | 438/110 |

FOREIGN PATENT DOCUMENTS

| | | |
|---|---|---|
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

* cited by examiner

SEMICONDUCTOR DEVICE HAVING INCREASED MOISTURE PATH AND INCREASED SOLDER JOINT STRENGTH

BACKGROUND OF THE INVENTION

1. Field of the Invention

The present invention relates to a method for manufacturing semiconductor packages and, more particularly but not by way of limitation, to an improved method of manufacturing semiconductor packages having longer moisture-permeation paths, restoration of original coloring, improved silver-plating of leads in the package, improved solder joint force, and improved marking.

2. History of Related Art

It is conventional in the electronics industry to encapsulate one or more semiconductor devices, such as integrated circuit chips, in a semiconductor package. These plastic packages protect a chip from environmental hazards, and provide a method for electrically and mechanically attaching the chip to an intended device. Recently, such semiconductor packages have included metal leadframes for supporting an integrated circuit die which is bonded to a chip paddle region thereof. Bond wires which electrically connect pads on the integrated circuit die to individual leads of the leadframe are then incorporated. A hard plastic encapsulant material which covers the bond wire, the integrated circuit die and other components, forms the exterior of the package. A primary focus in this design is to provide the die with adequate protection from the external environment in a reliable and effective manner.

As set forth above, the semiconductor package herein described incorporates a leadframe as the central supporting structure of such a package. A portion of the leadframe completely surrounded by the plastic encapsulant is internal to the package. Portions of the leadframe extend internally from the package and are used to connect the package externally. More information relative to leadframe technology may be found in Chapter 8 of the book *Micro Electronics Packaging Handbook,* (1989), edited by R. Tummula and E. Rymaszewski which is incorporated herein by reference. This book is published by Van Nostrand Reinhold, 115 Fifth Avenue, New York, N.Y.

Once the integrated circuit dies or chips have been produced and encapsulated in a semiconductor package as described above, they may be used in a variety of electronic appliances. A wide variety of electronic devices have been developed in recent years, such as cellular phones, portable computers, etc. Each of these devices typically include a motherboard on which a significant number of such semiconductor packages are utilized to provide multiple electronic functions. These electronic appliances are themselves required to be reduced in size as consumer demand increases. Accordingly, not only are semiconductor chips highly integrated, but also semiconductor packages are miniaturized with a high increase of package mounting density.

According to such miniaturization tendency, semiconductor packages, which transmit electrical signals from semiconductor chips to motherboards and support the semiconductor chips on the motherboards, have been designed to have a size of about 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are manufactured in the same manner. A description of several problems in the semiconductor package industry are described below.

During the manufacturing for a semiconductor package, electrical testing is required to insure proper function of the semiconductor package. This testing occurs after the semiconductor package has been separated from a matrix of semiconductor packages by singulation. Because of this limitation, a multitude of semiconductor packages must be individually tested. The time required to individually test these packages, in addition to the small size of the packages, results in decreased efficiency and higher costs.

Due to the large number of leads present in modern miniaturized semiconductor packages, it is desirable to locate a recognition mark on the semiconductor package to identify the first lead. In prior art semiconductor packages, the recognition mark is difficult to form on the package body due to the narrow region formed at the top surface of the encapsulant after the package has been formed. In addition, the position of the mark in the semiconductor package area reduces the marking area for characters, symbols and/or logos. Further, when the recognition mark is deep, the conductive wires are disadvantageously exposed due to the thinness of the packaged body.

During a typical singulation process in the manufacturing of the packaged semiconductor, a burr is formed at the end of the internal lead directed downwardly along the cut or external side of the internal lead. This burr reduces the contact area between the internal lead and the motherboard during mounting which adversely affects the solder joint force. In addition, due to the presence of the burr, solder used to affix the packaged semiconductor to the motherboard cannot sufficiently ascend along the wall of the end of the internal lead, so that the solder joint force of the internal lead is further reduced.

Typical semiconductor packages have a silver plated layer in such a design that the layer is positioned inside the package body. Such a conventional leadframe or semiconductor package suffers from a significant problem in that it is very difficult to conform to the tolerances required regarding the application of the silver plated layer. When the silver plated layer is positioned inside the packaged body, the plated layer must be confined within a relatively small space, which requires that the plating technique be very precise. The increased precision requirement often leads to defective semiconductor packages.

A further problem of a conventional semiconductor package is that a typical chip paddle or die pad has a half-etched section of the chip paddle that is formed only at a lower edge area of the chip paddle along the chip paddle perimeter. The size or length of the half-etched section is insufficient to thoroughly prevent moisture from permeating into the vicinity of the semiconductor chip. Thus, much moisture may be collected in the vicinity of the semiconductor chip under the high temperature conditions that exist during the operation of a semiconductor chip. The moisture may then spread widely over the inside of the semiconductor package, resulting in cracking of the semiconductor package or causing protuberances to form on the surface of the semiconductor package.

Finally, in a typical process to deflash a semiconductor, the leadframes may turn a yellowish color. A discolored semiconductor package, even though not dysfunctional, may have a reduced commercial value. In addition, a fatal problem may occur when the leadframe packages are subjected to electronic sensing. The leadframe may be so discolored that electrical sensing apparatuses cannot accurately detect the internal leads because of a decrease in the light reflected from the discolored internal leads. This problem is most prevalent when testing the semiconductor packages or mounting the packages onto motherboards. The result may be a large number of defects that can occur during the subsequent mounting process.

BRIEF SUMMARY OF THE INVENTION

In the various embodiments of the present invention, there is disclosed a semiconductor package and a method for manufacturing the same. First, a leadframe is provided. A planar or substantially planar die pad is within the leadframe and is connected to the leadframe by a plurality of tie bars. The die pad is half-etched on a perimeter of the upper and lower surface to increase the moisture-permeation path of the finished package. A plurality of finger-like rectangular leads extend from the leadframe towards the die pad without contacting the die pad. A silver plating layer is formed on the upper surface of the leadframe. A semiconductor chip having a plurality of bond pads is mounted on the upper surface of the die pad or chip paddle in the leadframe. Dam bars are provided on the boundary of the leads to limit flow of encapsulation material during packaging. Next, a bond wire or equivalent conductor is connected electrically between each bond pad of the semiconductor chip and a first surface of one of the leads.

The leadframes are then encapsulated by a viscous encapsulant material. The encapsulant material is then hardened. The encapsulant material at least partially covers the semiconductor chip, the bond wires, a first surface of the leads, the upper surface of the die pad, the side surfaces of the die pad and leads, and all or part of the frames around the die pad. A lower second surface of the leadframe, including a lower second surface of the die pad and leads, may optionally be covered with the encapsulant material, but may not be covered depending on the requirements of the practitioner.

The package is next submerged in an M-pyrol chemical before being rinsed. The rinsed package is next subjected to electro-deflashing to exfoliate flashes from the semiconductor package. The package is then subjected to a second rinsing step. Consequently, water is jetted at a predetermined pressure to the surface of the package to completely remove the flash from the die pad and internal leads. Depending on the practitioner, the package may be treated with a sulfuric ($H_2SO_4$)-based solution to restore the internal leads to their original color either before the water-jetting step or after the water-jetting step. Finally, the semiconductor package is off-loaded from the deflashing apparatus.

Prior to singulation, the externally exposed bottom surfaces of the leads are plated with, for example, copper, gold, solder, tin, nickel, or palladium to form a predetermined thickness of a plating layer. The package is then singulated from the leadframe. The singulation step comprises positioning the leadframe such that the semiconductor chip is directed downwardly; positioning the leadframe between a bottom clamp and a top clamp to firmly clamp the dam bars and the leads of the leadframe; cutting with a punch or similar apparatus the boundary areas between the leads, the tie bars and the package simultaneously, thereby causing a burr to form at the peripheral side surface of the leads in the upward direction. The absence of a burr on the lower side of the leads allows solder that is used to mount the package to a motherboard to more easily bond to the side of the leads.

The finished package is next marked with a recognition mark to enable a user to more easily identify the first lead. The mark may comprise: a mark formed at the side of the package; a side notch formed over the entire area of one side of the package body; the entire bottom surface of the package body; a protuberance from any side of the die pad; a circular exposed area formed on any of the tie bars; an exposed area spaced at a distance from or connected to the downward facing exposed tie bar area; and a notch formed at any side of the die pad.

BRIEF DESCRIPTION OF THE DRAWINGS

A more complete understanding of the method and apparatus of the various embodiments of the present invention may be obtained by reference to the following detailed description, with like reference numerals denoting like elements, when taken in conjunction with the accompanying drawings wherein.

DETAILED DESCRIPTION OF THE INVENTION

Figure 1:
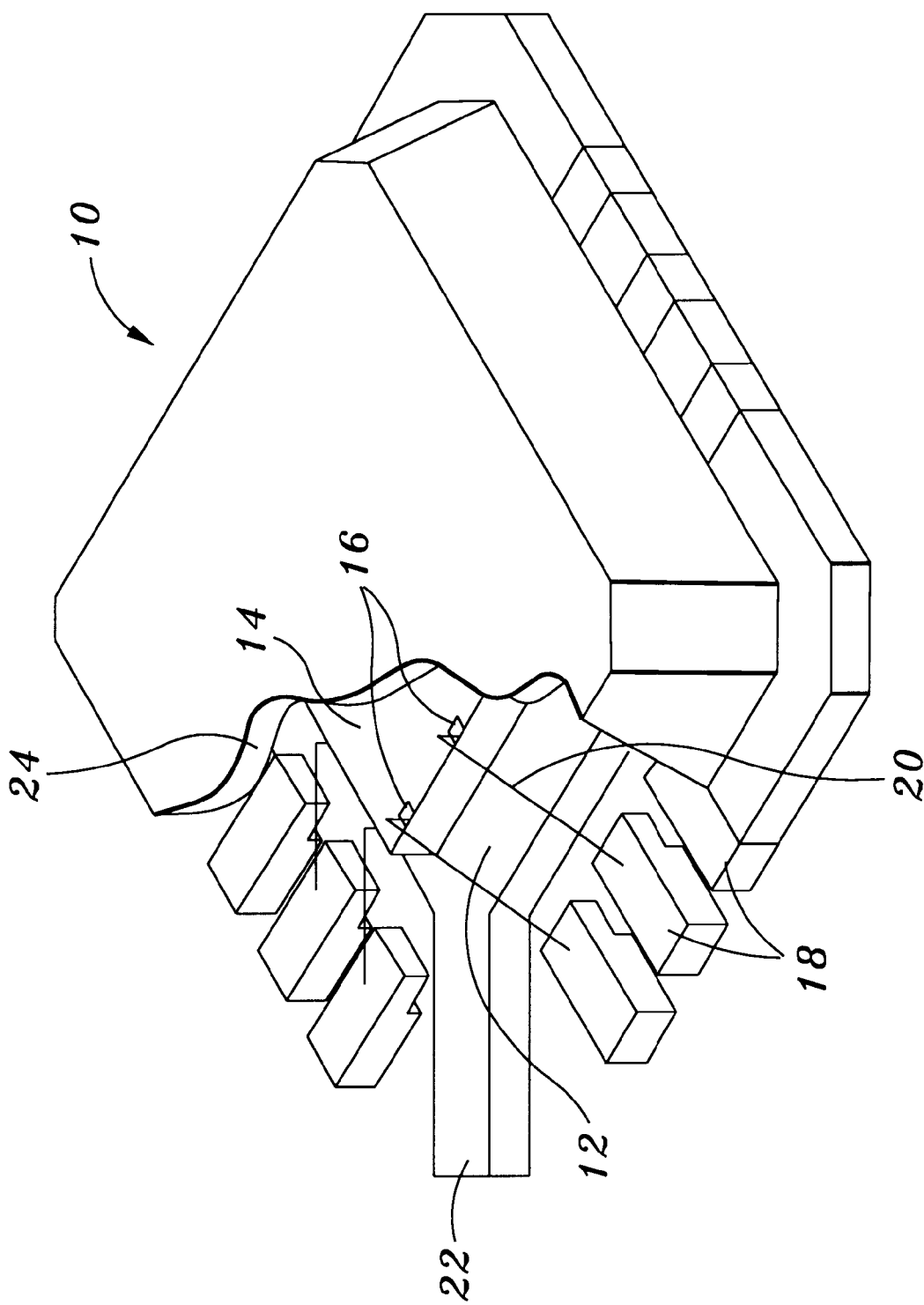
FIG. 1 is a cut-away perspective view of an embodiment of a semiconductor package in accordance with the principles of the present invention.

Referring now to FIG. 1, shown is a semiconductor package 10. Semiconductor package 10 is comprised of a planar or substantially planar die pad 12. A semiconductor chip 14 is located on an upper surface of die pad 12. Semiconductor chip 14 has a plurality of bond pads 16 on an upper surface of the semiconductor chip 14. A plurality of leads 18 surround die pad 12 and extend away from die pad 12. The leads 18 are in electrical communication with bond pads 16 of semiconductor chip 14. Preferably, each bond pad 16 is electrically connected with a respective lead 18 by a bond wire 20. A tie bar 22 extends from each corner of die pad 12. An encapsulating material 24 encapsulates the die pad 12, leads 18, bond wires 20 and tie bars 22.

Figure 2:
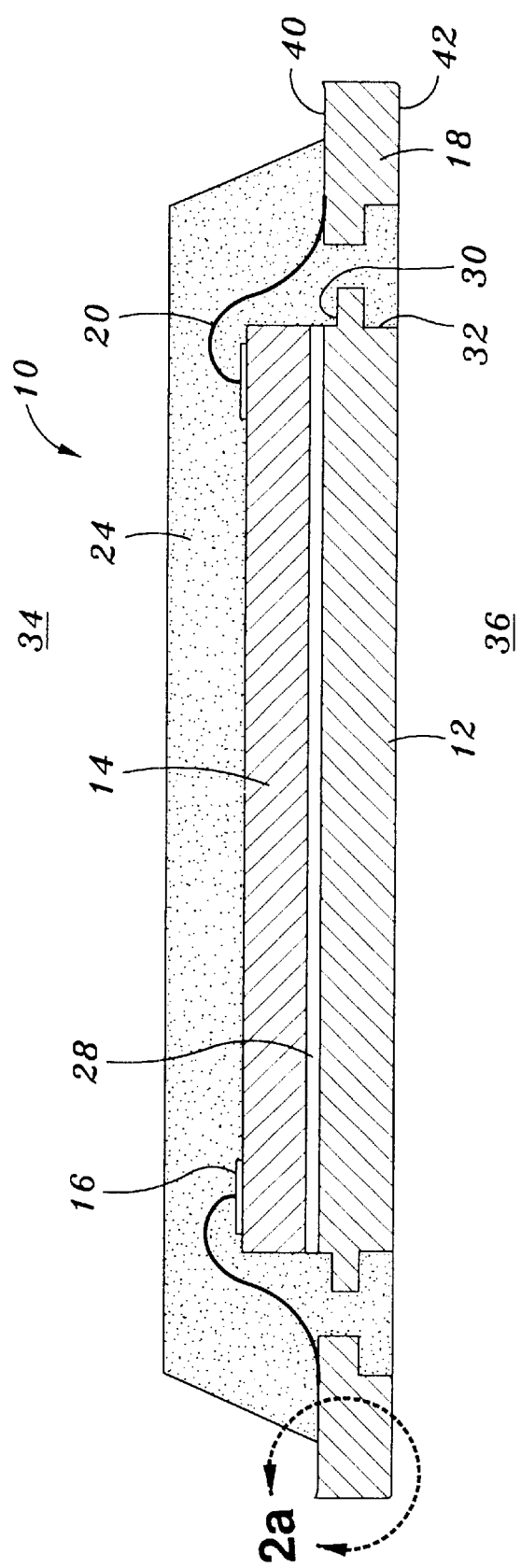
FIG. 2 is a cross section view of a semiconductor package having a upper and lower half etch on the chip paddle and a upwardly facing burr in accordance with the principles of the present invention.
Figure 2A:
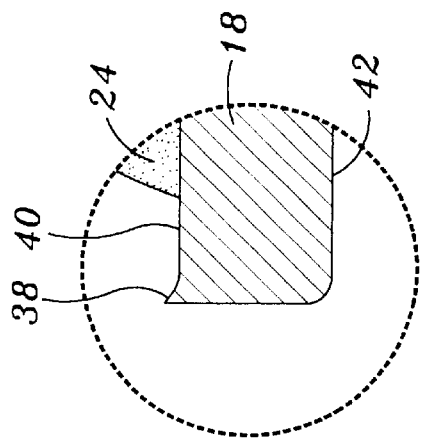
FIG. 2a is a magnified view of one portion of the semiconductor package of FIG. 2.

Referring now to FIGS. 2, and 2a, a cross-sectional view of the semiconductor package 10 and an enlarged cross-sectional view of semiconductor package 10 are shown, respectively. Referring more particularly to FIG. 2, semiconductor chip 14 is shown affixed to die pad 12 with an adhesive 28. Die pad 12 of FIG. 2 has an upper half-etch portion 30 and a lower half-etch portion 32 on a perimeter of die pad 12. Additionally, the semiconductor package 10 has a chip side 34 and a leadframe side 36. A burr 38 extends upwardly, i.e. away from the chip side 34 of the leads 18 (FIG. 2a).

Figure 3:
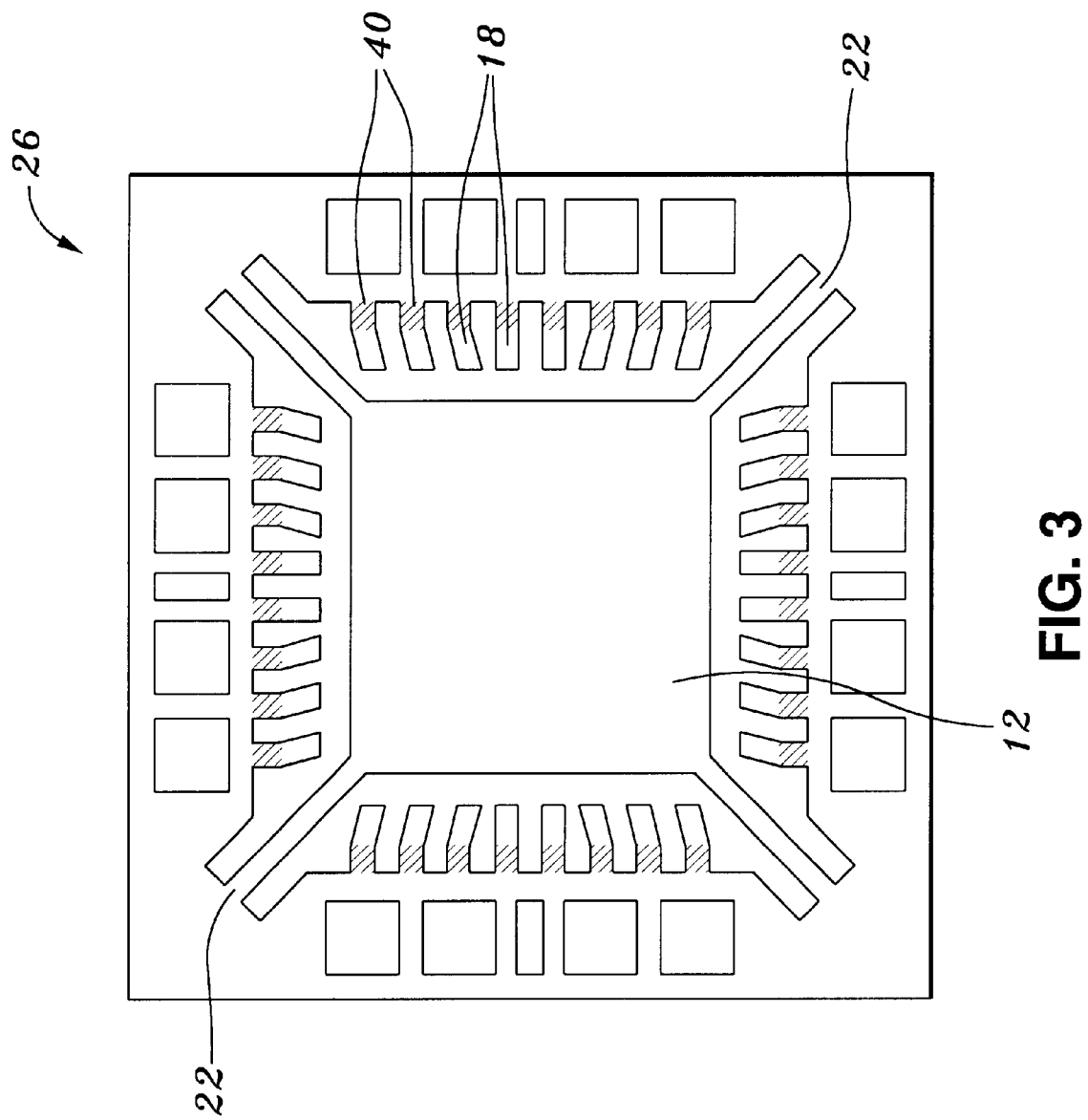
FIG. 3 is a top plan view of a leadframe showing plated leads in accordance with the principles of the present invention.

Preferably, leads 18 have an upper plating layer 40 deposited on an upper surface, i.e., chip side 34, of leads 18. The upper plating layer 40 preferably covers a portion of leads 18 that are exposed on the semiconductor package 10 after encapsulating material 24 has been added. The preferred location for depositing the upper plating layer 40 on the leadframe 26 is shown by the shaded areas in FIG. 3. In one embodiment, the upper plating layer 40 is comprised of a silver coating, although other similar materials may be used. The upper plating layer 40 is deposited to a predetermined thickness on the upper surface of the leads 18 to the boundary on the leadframe to which the semiconductor package 10 is later formed. In addition, although not shown, the silver-plated, or the upper plating layer 40 may be formed over their whole upper surface, i.e. chip side 34 of the leads 18 beyond the boundary line (not shown) of the semiconductor package 10.

Referring back to FIGS. 2 and 2a, a lower plating layer 42 is preferably deposited on a bottom surface of leads 18. The lower plating layer 42 preferably covers all the exterior exposed bottom surface of each lead 18. The lower plating layer 42 is an electrically conductive material. Preferably, the lower plating layer 42 is comprised of copper, gold, solder, tin, nickel, or palladium.

Referring now to FIGS. 4–16, on a completed semiconductor package 10 it is desirable to place a recognition mark designated generally as 44 on an external surface of semiconductor package 10 for assisting a user in locating a first lead. The recognition mark 44 may be a notch, a protuberance, a printed or painted designation or other type of recognizable mark. The recognition mark 44 may be located at various locations on the external surfaces of a semiconductor package 10.

Figure 4:
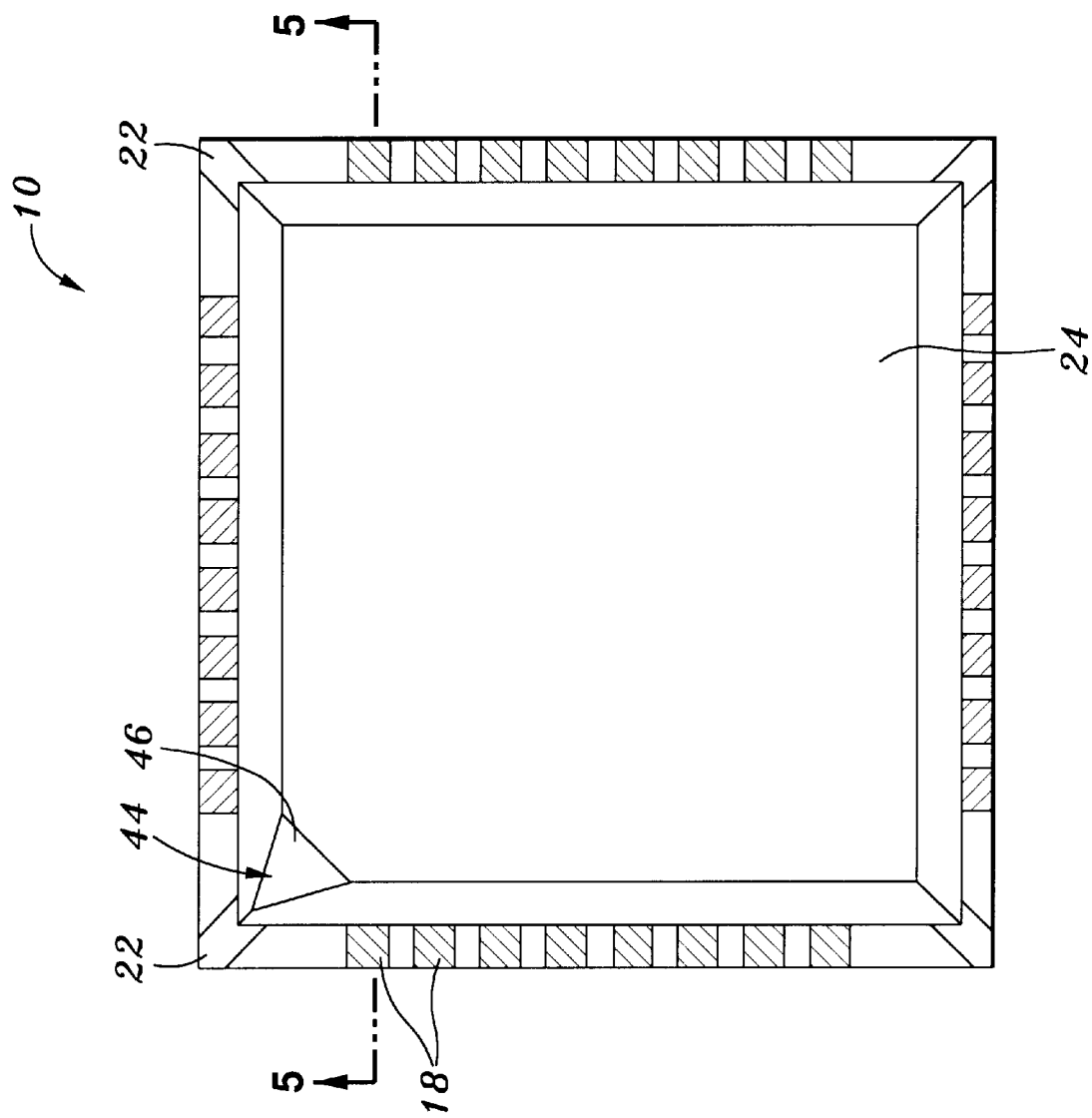
FIG. 4 is a top plan view of an embodiment of a semiconductor package with a recognition mark in accordance with the principles of the present invention.

Referring now more particularly to FIG. 4, a chamfered corner 46 serves as a recognition mark 44. The chamfered corner 46 is formed on an exterior surface of the encapsulated material 24 of semiconductor package 10.

Figure 5:
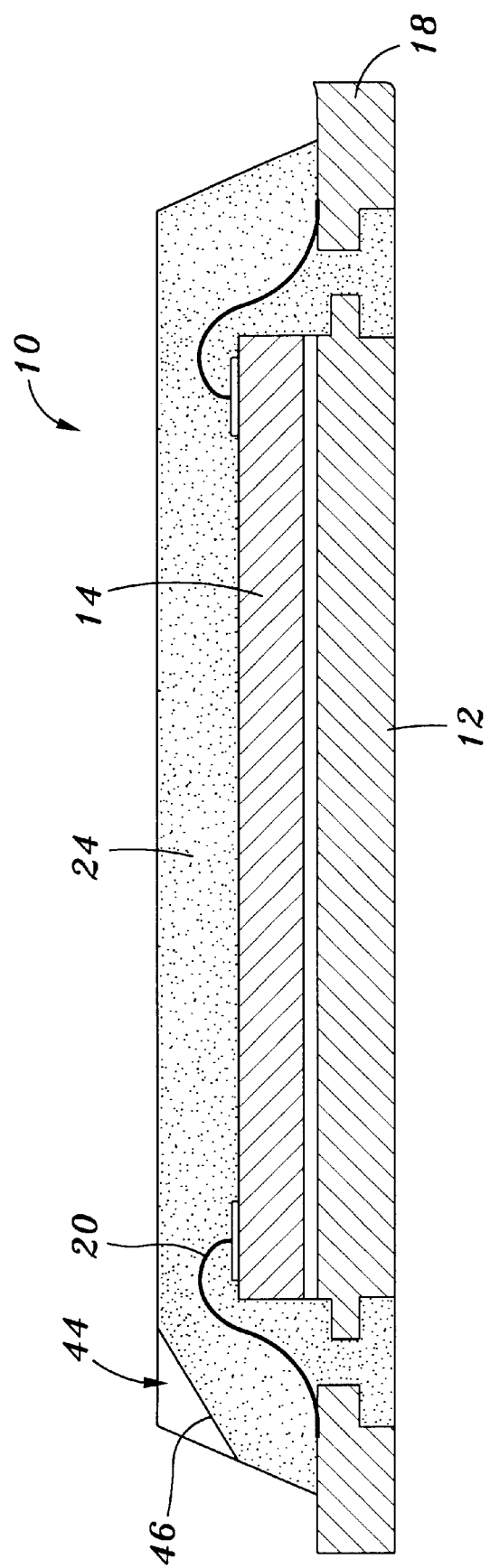
FIG. 5 is a cross section of a semiconductor package taken along line 5—5 of FIG. 4 showing a recognition mark in accordance with an embodiment of the present invention.

Referring now to FIG. 5, shown is a cross-section view of a semiconductor package 10 wherein a chamfered corner 46 is formed in an edge of encapsulation material 24 of the semiconductor package 10. Chamfered corner 46 serves as a recognition mark 44.

Figure 6:
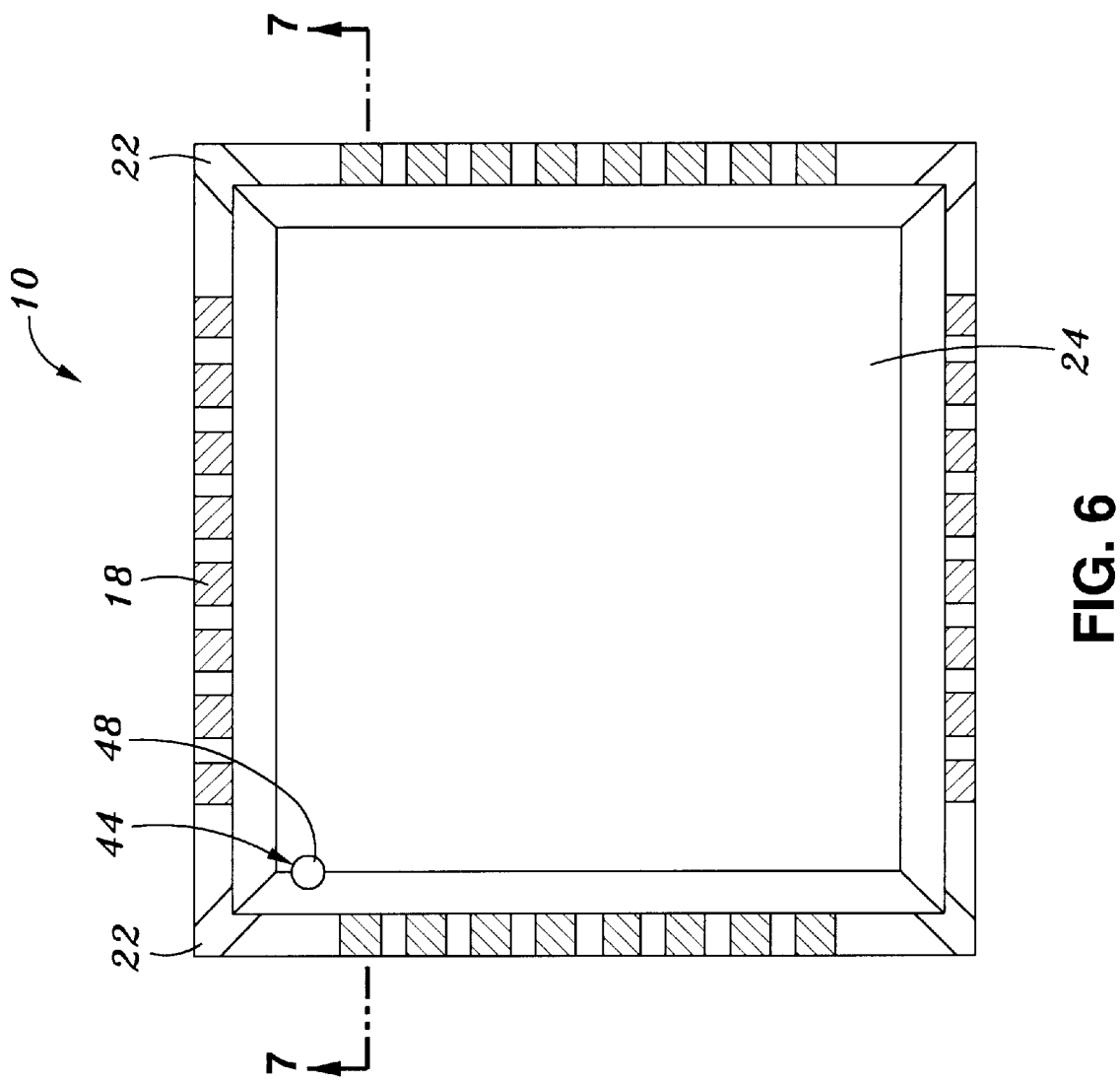
FIG. 6 is a is a top plan view of another embodiment of a semiconductor package with a recognition mark in accordance with the principles of the present invention.

Referring now to FIG. 6, shown is a top plan view of a semiconductor package 10. An indentation 48, which serves as a recognition mark 44, is formed on an upper edge of the encapsulation material 24.

Figure 7:
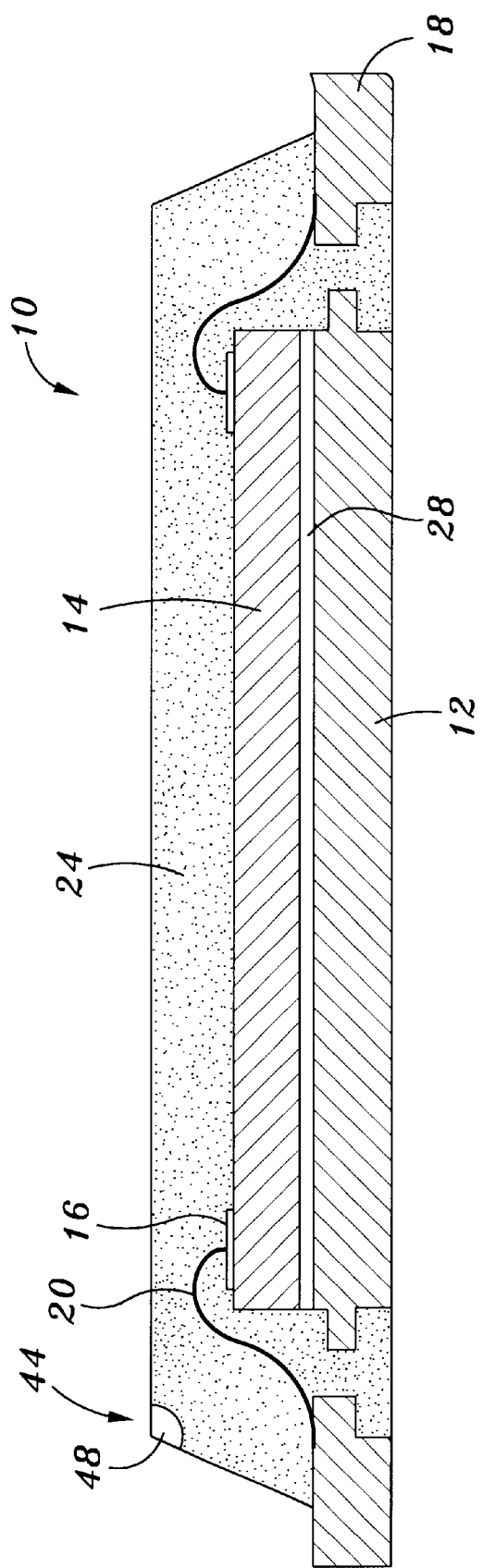
FIG. 7 is a cross section view taken along line 7—7 of FIG. 6 showing an embodiment of a recognition mark in accordance with the principles of the present invention.

Referring now to FIG. 7, shown is a cross-section view taken along lines 7—7 of FIG. 6. The cross-section view of FIG. 7 also shows an indentation 48 that is formed in the encapsulation material 24 of the semiconductor package 10. Indentation 48 serves as a recognition mark 44.

Figure 8:
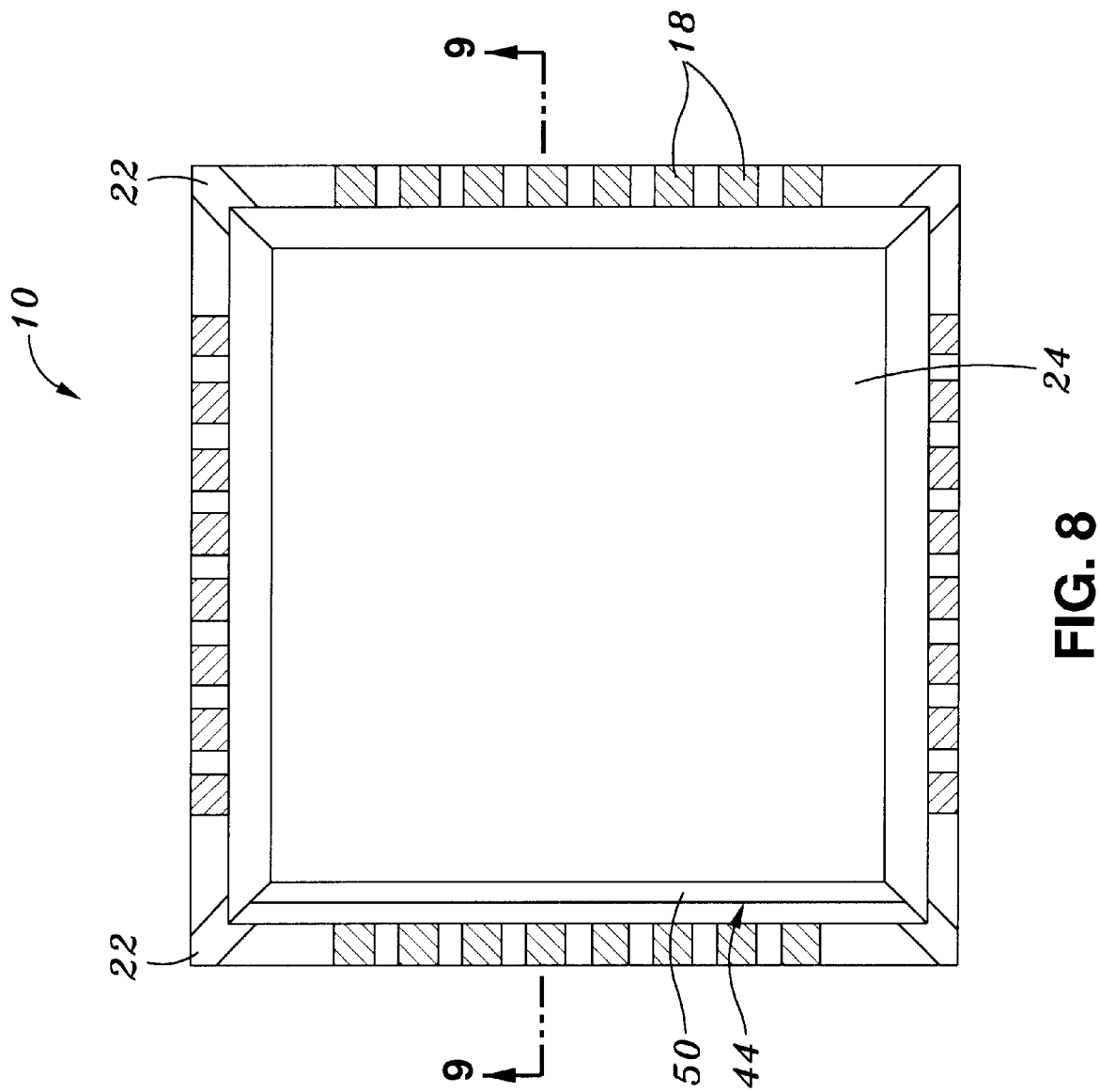
FIG. 8 is a is a top plan view of another embodiment of a semiconductor package with a recognition mark in accordance with the principles of the present invention.

Referring now to FIG. 8, shown is a top plan view of a semiconductor package 10. A longitudinal surface 50 is visible running along one edge of the encapsulation material 24 of the semiconductor package 10. Longitudinal surface 50 serves as a recognition mark 44.

Figure 9:
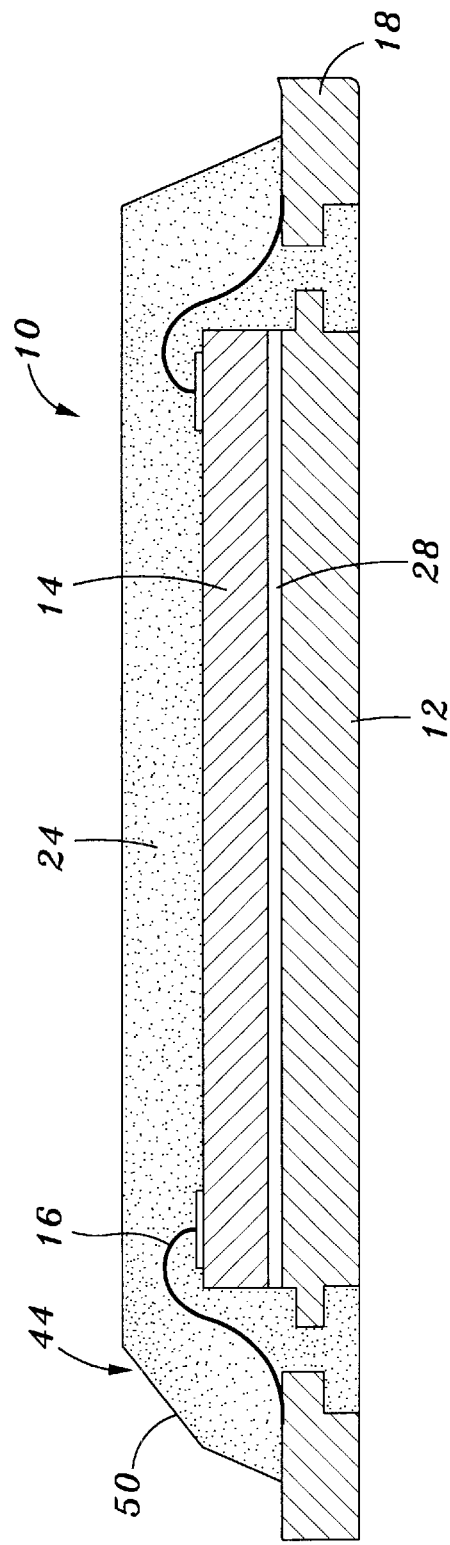
FIG. 9 is a cross section view taken along line 9—9 of FIG. 8 showing an embodiment of a recognition mark in accordance with the principles of the present invention.

Referring now to FIG. 9, shown is a cross-section view of semiconductor package 10 taken along lines 9—9 of FIG. 8. Longitudinal surface 50 is visible on an external edge of the semiconductor package 10 formed in the encapsulation material 24. Longitudinal surface 50 serves as a recognition mark 44.

Figure 10:
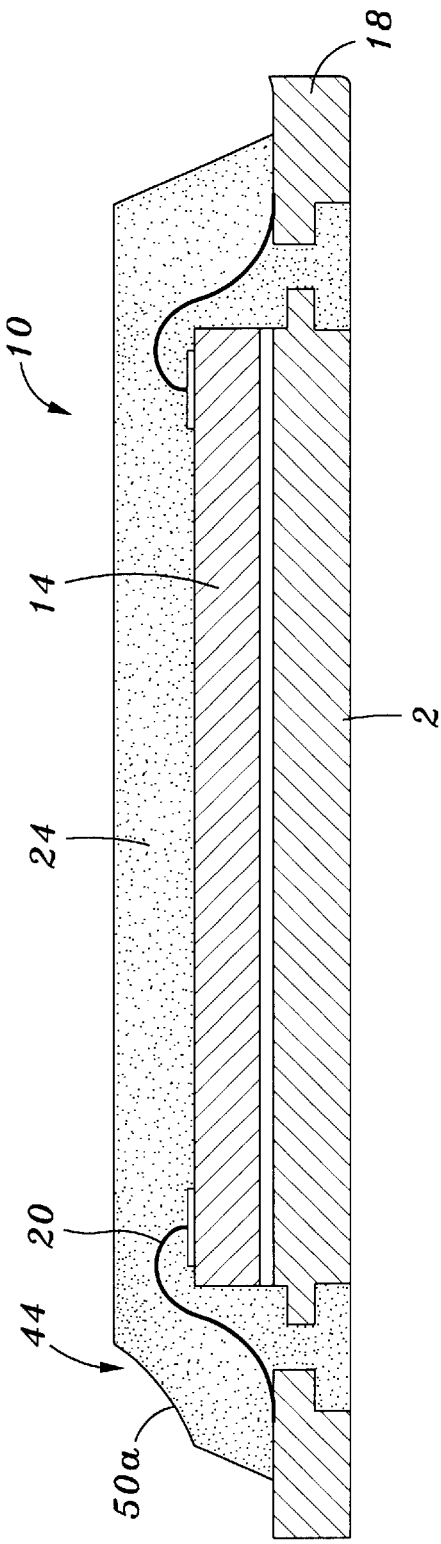
FIG. 10 is a cross section view of yet another embodiment of a semiconductor package with a recognition mark in accordance with the principles of the present invention.

Referring now to FIG. 10, shown is a cross-sectional view taken along lines 8—8 of FIG. 8 that shows a longitudinal surface 50a wherein longitudinal surface 50a is concave. Longitudinal surface 50a serves as a recognition mark 44.

Figure 11:
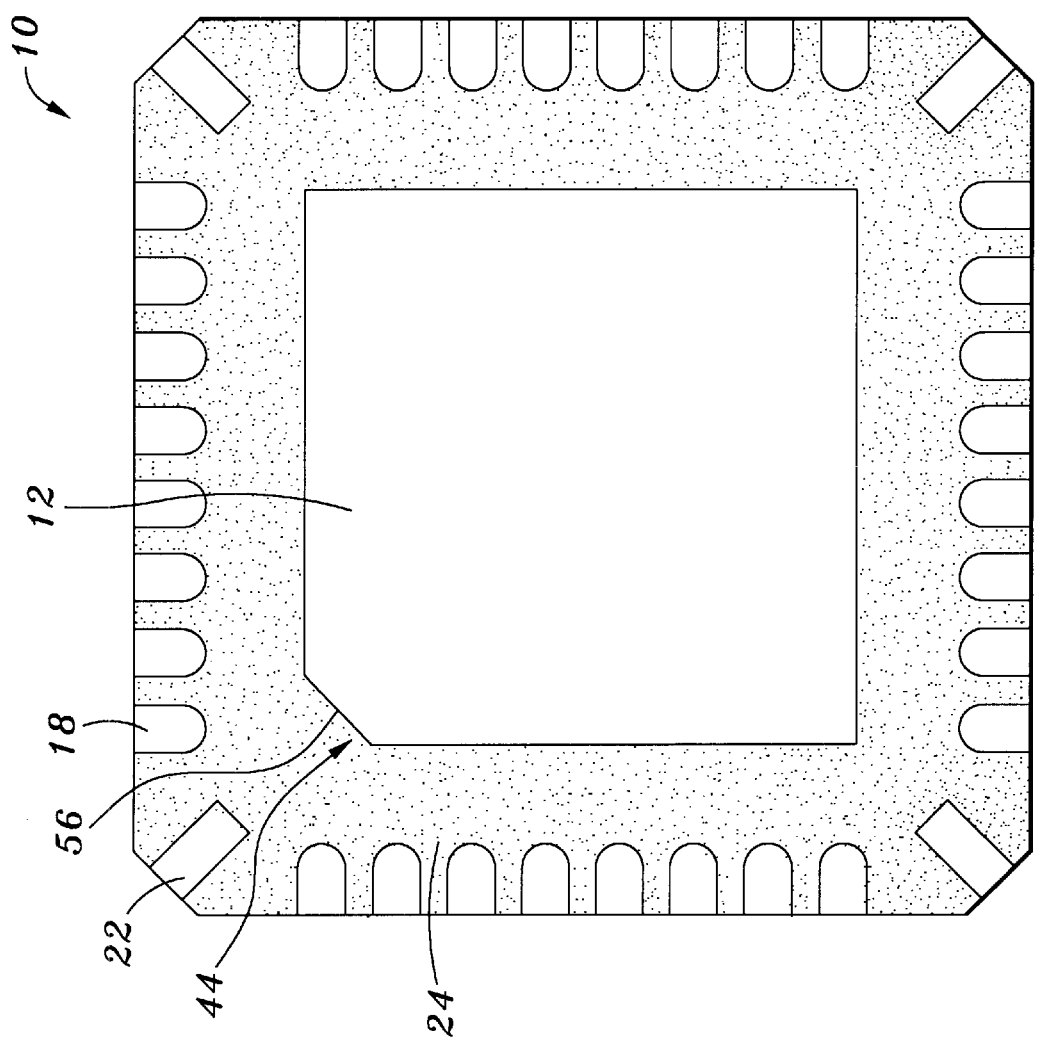
FIG. 11 is a bottom plan view of an embodiment of a semiconductor package with a recognition mark formed thereon.

Referring now to FIGS. 11–16, recognition marks 44 may be located on a bottom surface of a semiconductor package 10. Referring now to FIG. 11 in particular, shown is a plan view of a bottom surface of semiconductor package 10. The bottom surface of die pad 12 is visible. On a corner of die pad 12 is a chamfered corner 56 which may be used as a recognition mark 44.

Figure 12:
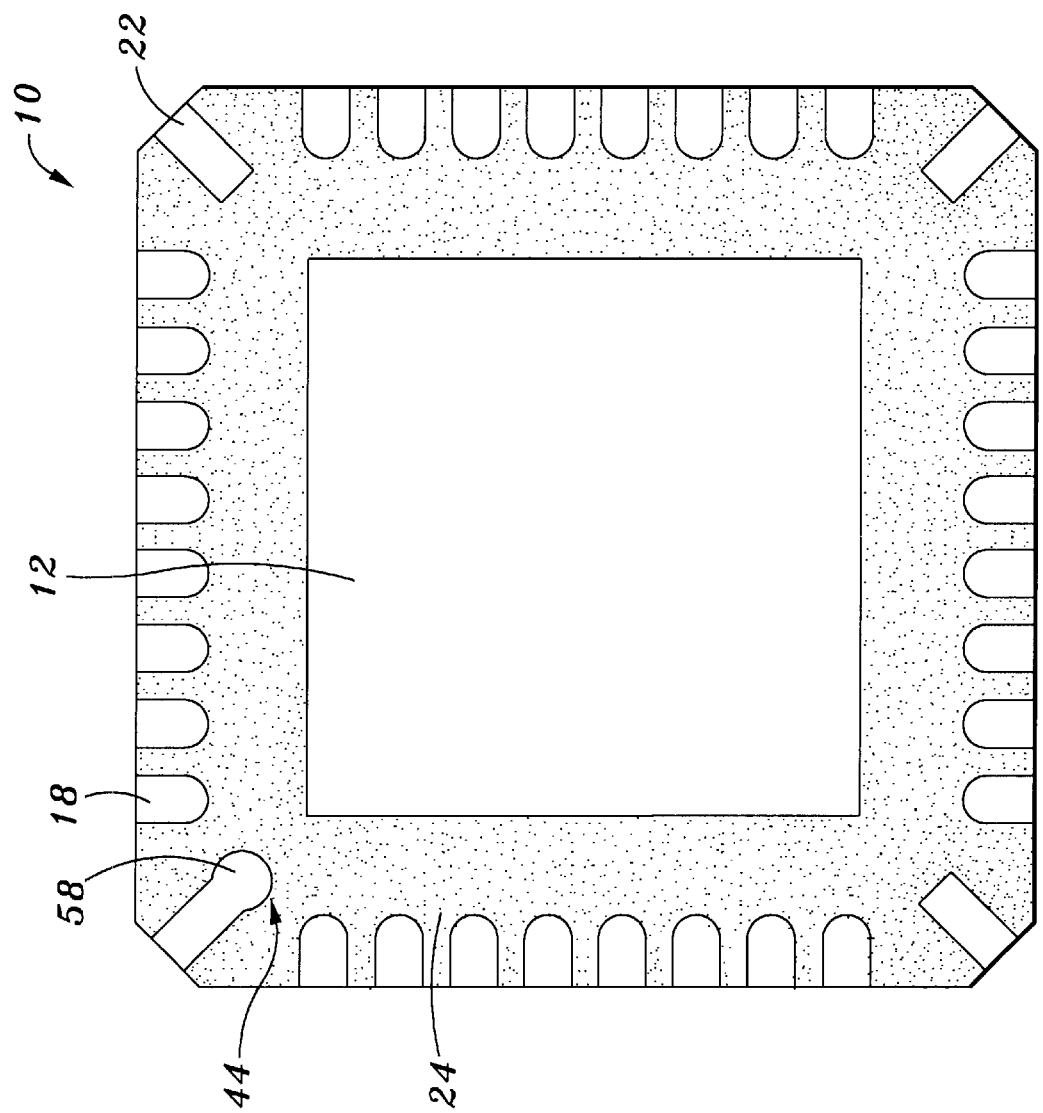
FIG. 12 is a bottom plan view of an embodiment of a semiconductor package with a recognition mark formed thereon.

Referring now to FIG. 12, an irregularly shaped tie bar 58 may be used as a recognition mark 44. The irregularly shaped tie bar 58 has an enlarged rounded end to distinguish it from the remaining tie bars 22 that are also visible in FIG. 12.

Figure 13:
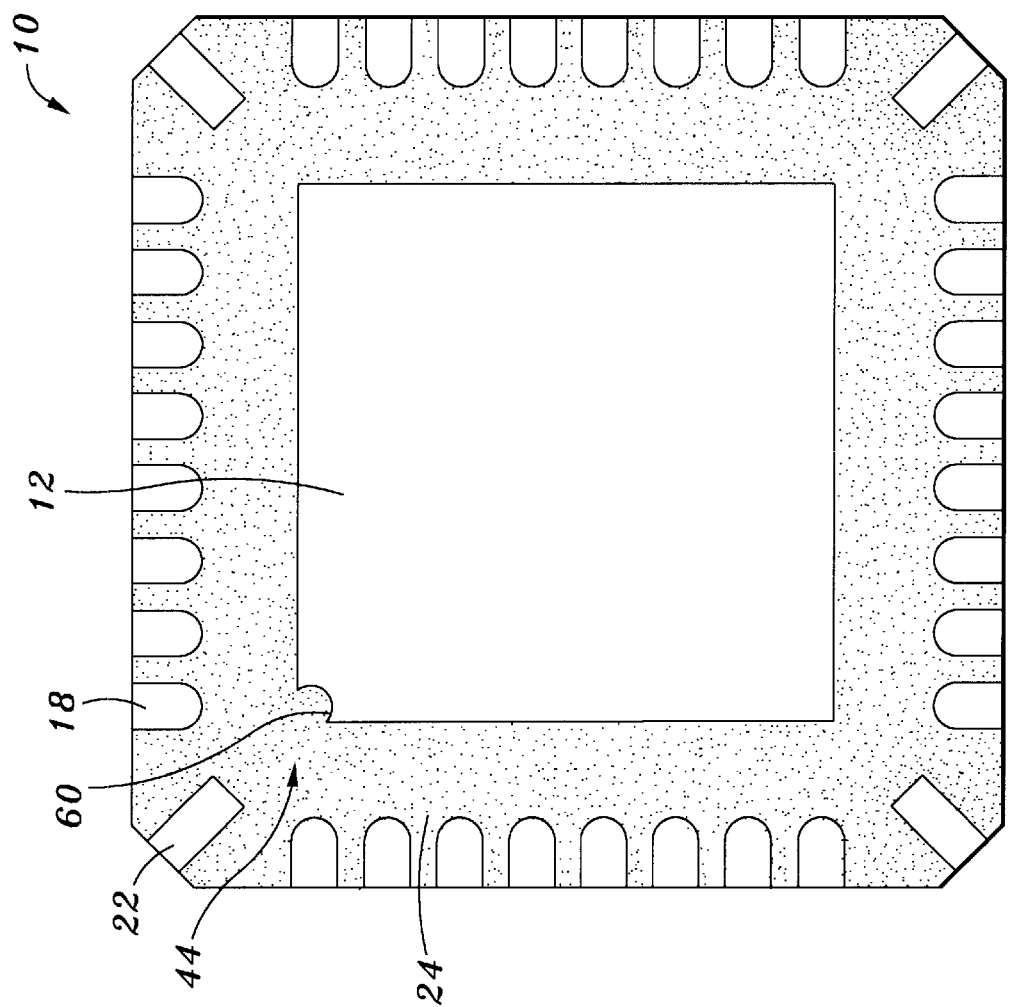
FIG. 13 is a bottom plan view of an embodiment of a semiconductor package with a recognition mark formed thereon.
Figure 14:
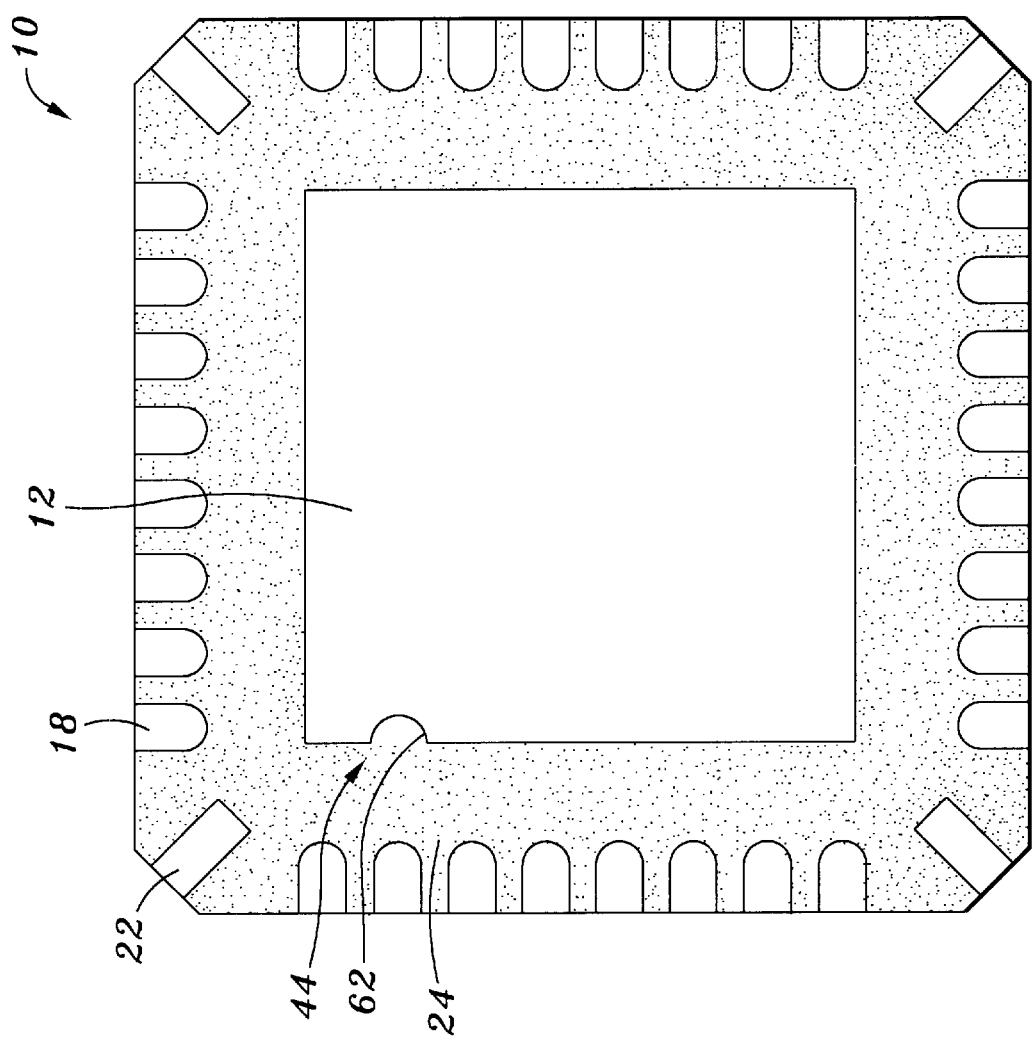
FIG. 14 is a bottom plan view of another embodiment of a semiconductor package with a recognition mark formed thereon.

Referring now to FIG. 13, a semi-circular portion 60 has been removed from a corner of die pad 12. The semi-circular portion 60 serves as a recognition mark 44. Another semi-circular portion 62 is shown in FIG. 14 along an edge of die pad 12 and may also be used as a recognition mark 44. Additionally, a stand-alone mark 64 may be provided on a lower surface of semiconductor package 10 to serve as a recognition mark.

Figure 15:
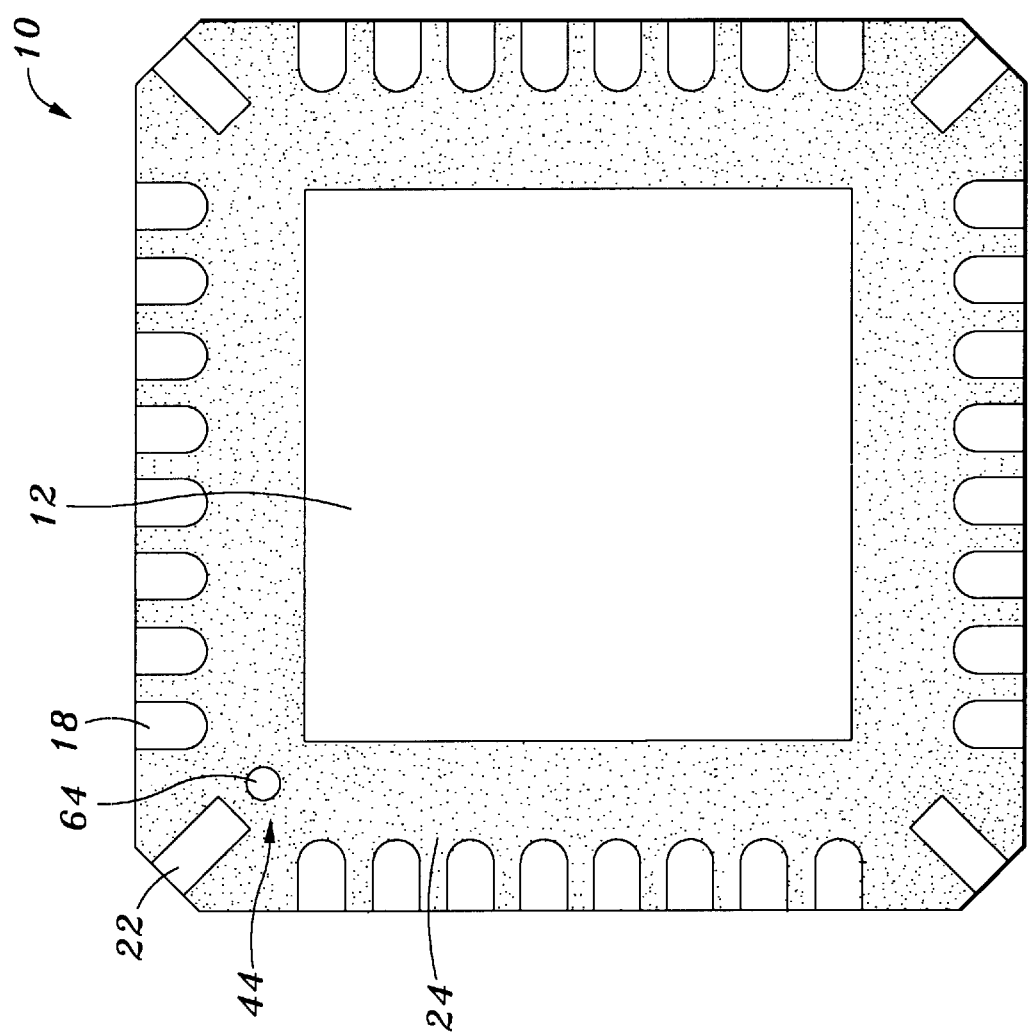
FIG. 15 is a bottom plan view of another embodiment of a semiconductor package with a recognition mark formed thereon.

Referring in particular to FIG. 15, stand-alone mark 64 is positioned between a tie bar 22 and a corner of die pad 12.

Figure 16:
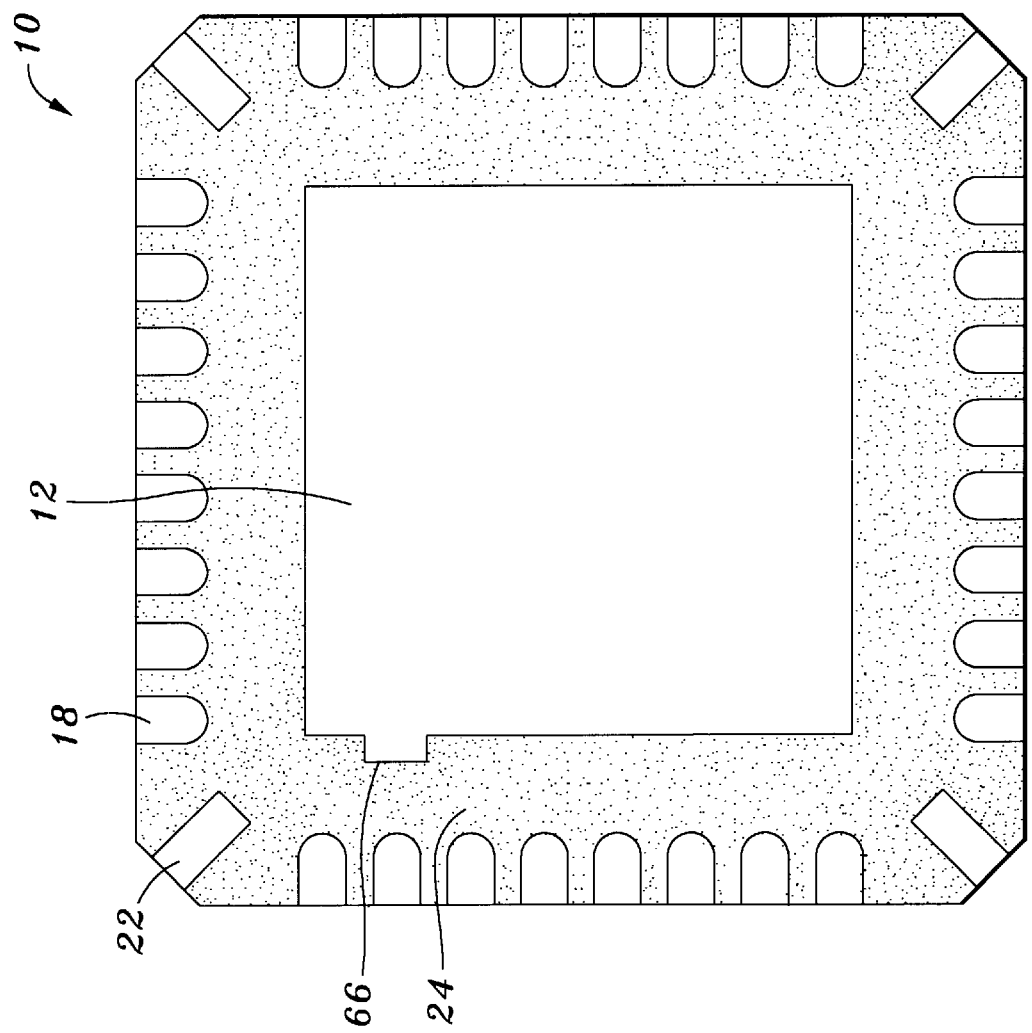
FIG. 16 is a bottom plan view of another embodiment of a semiconductor package with a recognition mark formed thereon.

Referring now to FIG. 16, shown is yet another variation to the types of recognition marks that may be used as marking area for characters, symbols and/or logos. Protrusion 66 is visible extending from an edge of die pad 12. It should be understood that the preceding examples of locations and types and shapes of recognition marks 44 are provided herein by way of example only and it is understood that other shapes, types and locations of and for recognition marks 44 may be used which fall within the scope of the invention.

Figure 17:
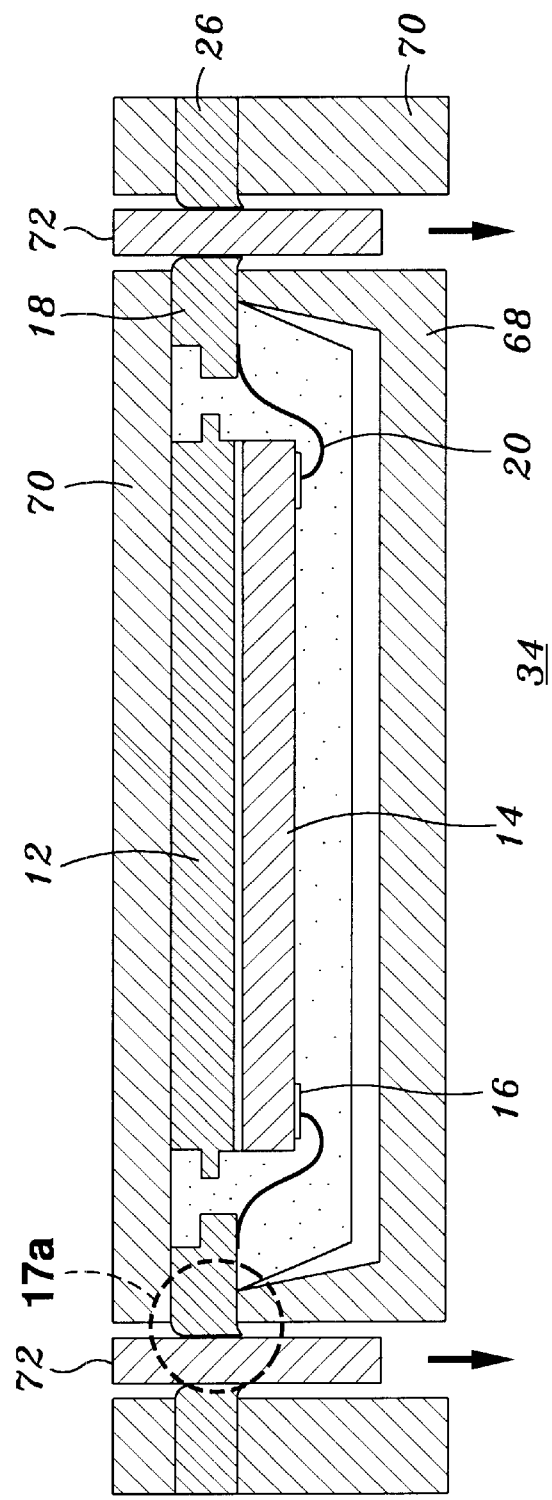
FIG. 17 is a cross section view of a semiconductor package undergoing singulation.
Figure 17A:
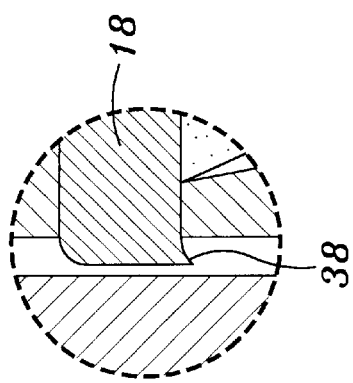
FIG. 17a is a magnified view of one portion of the semiconductor package of FIG. 17.

Referring now to FIG. 17, a method of singulating the semiconductor package 10 is shown. Semiconductor package 10 is placed between a lower mold 68 and an upper mold 70. The leadframe 26 extends out from the interior portions of lower mold 68 and upper mold 70. A punch 72 is utilized to shear off outer portions of leadframe 26. A portion of leadframe 26 remains exposed beyond the encapsulation material 24. As illustrated in FIG. 17*a*, at the location of singulating of the leadframe 26, a burr 38 is formed. Because the punch 72 acts from the lower or leadframe side 36, the burr 38 protrudes upwardly, i.e., towards the chip side 34 of the semiconductor package 10. The direction of protrusion of burr 38 can be important when the semiconductor package 10 is installed on a motherboard 76 as shown in FIG. 18.

Figure 18:
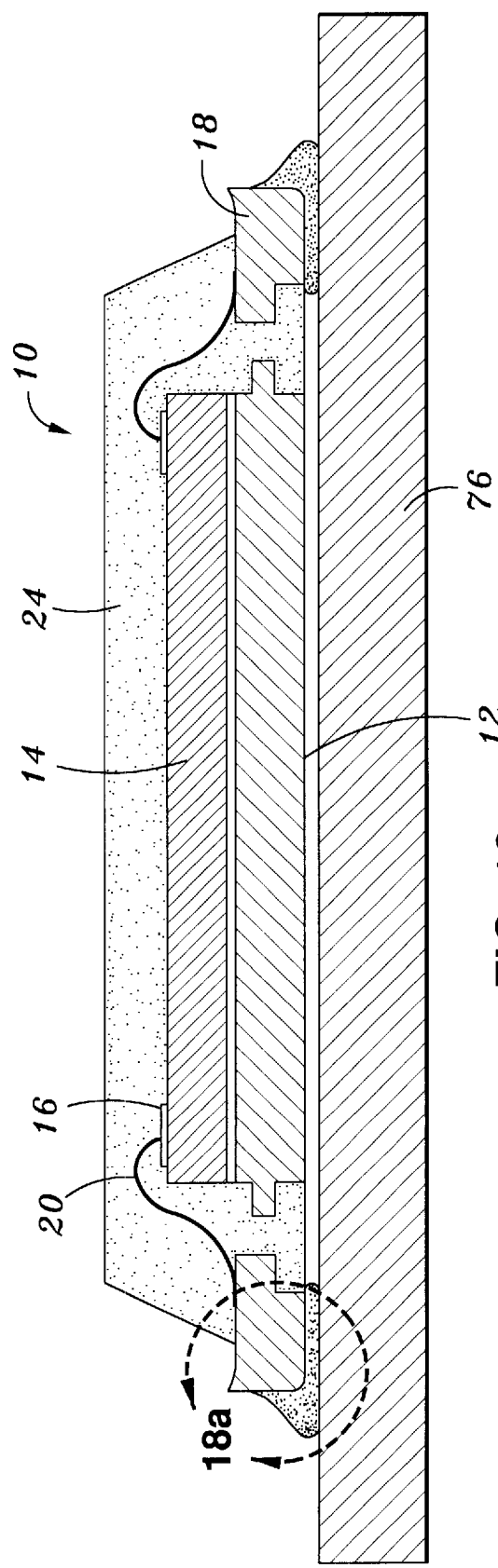
FIG. 18 is a cross section view of a semiconductor chip installed on a motherboard.
Figure 18A:
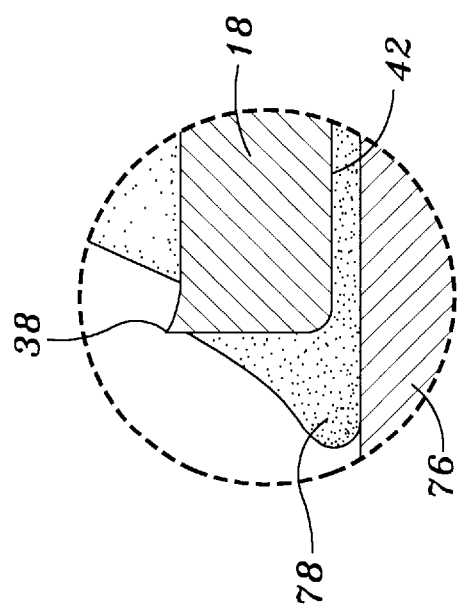
FIG. 18a is a magnified view of one portion of the semiconductor package of FIG. 18.

Referring now to FIG. 18, the leads 18 of semiconductor package 10 are soldered to motherboard 76. The burrs 38 are shown extending in the chip side direction 34, or away from, the motherboard 76. Consequently, a flow of solder material 78 is not inhibited by the presence of burr 38 on a lower side of lead 18. Lower plating layer 42 is also visible in the enlarged view shown in FIG. 18*a*. The lower plating layer 42 allows for easier bonding of the semiconductor package 10 to the mother board 76.

Figure 19:
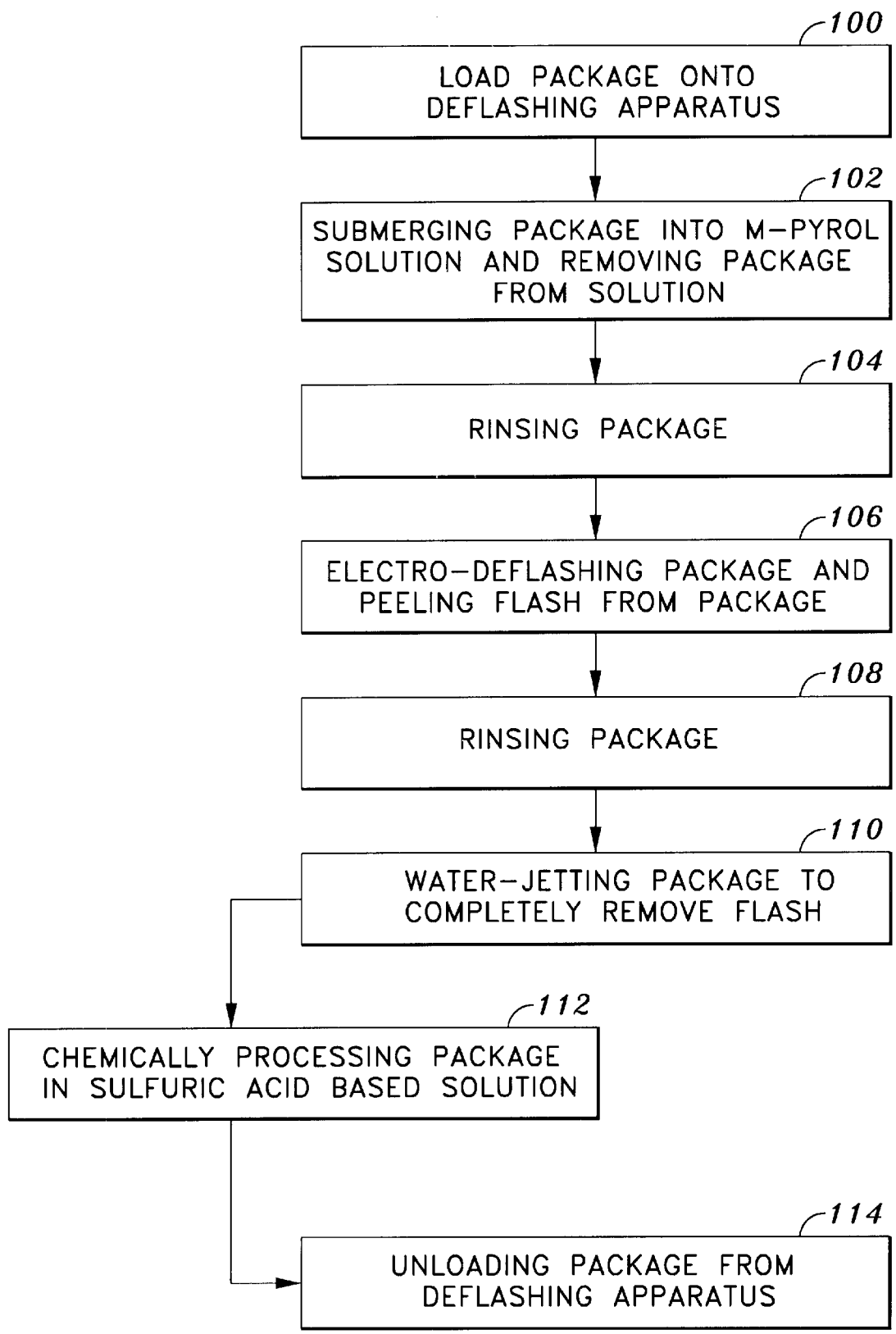
FIG. 19 is a flow chart describing a process for removing flash and for restoring the original color of exposed metal surfaces.

After singulation, flash may remain on the semiconductor package 10. Therefore, a method of removing the flash will be described below. Referring now to FIG. 19, shown is a flow diagram depicting a method of manufacture for semiconductor package 10. The semiconductor package 10 is loaded onto a deflashing apparatus, as set forth in box 100. The semiconductor package 10 is then submerged into an M-Pyrol solution, and then is subsequently removed, as is depicted in box 102. The semiconductor package 10 is then rinsed, as is indicated in box 104. The semiconductor package 10 is then subjected to an electro-deflashing process where the semiconductor package 10 is deflashed. The flash is subsequently peeled away from the semiconductor package 10 at regular intervals. The electro-deflashing step is depicted in box 106. The semiconductor package 10 is then rinsed as indicated in box 108, before the semiconductor package 10 is subjected to a water jetting process to completely remove the flash, as is indicated in box 110. The semiconductor package 10 is submerged in a sulfuric acid base solution, as indicated in box 112. Finally, the semiconductor package 10 is unloaded from the deflashing apparatus, as is indicated in box 114.

Figure 20:
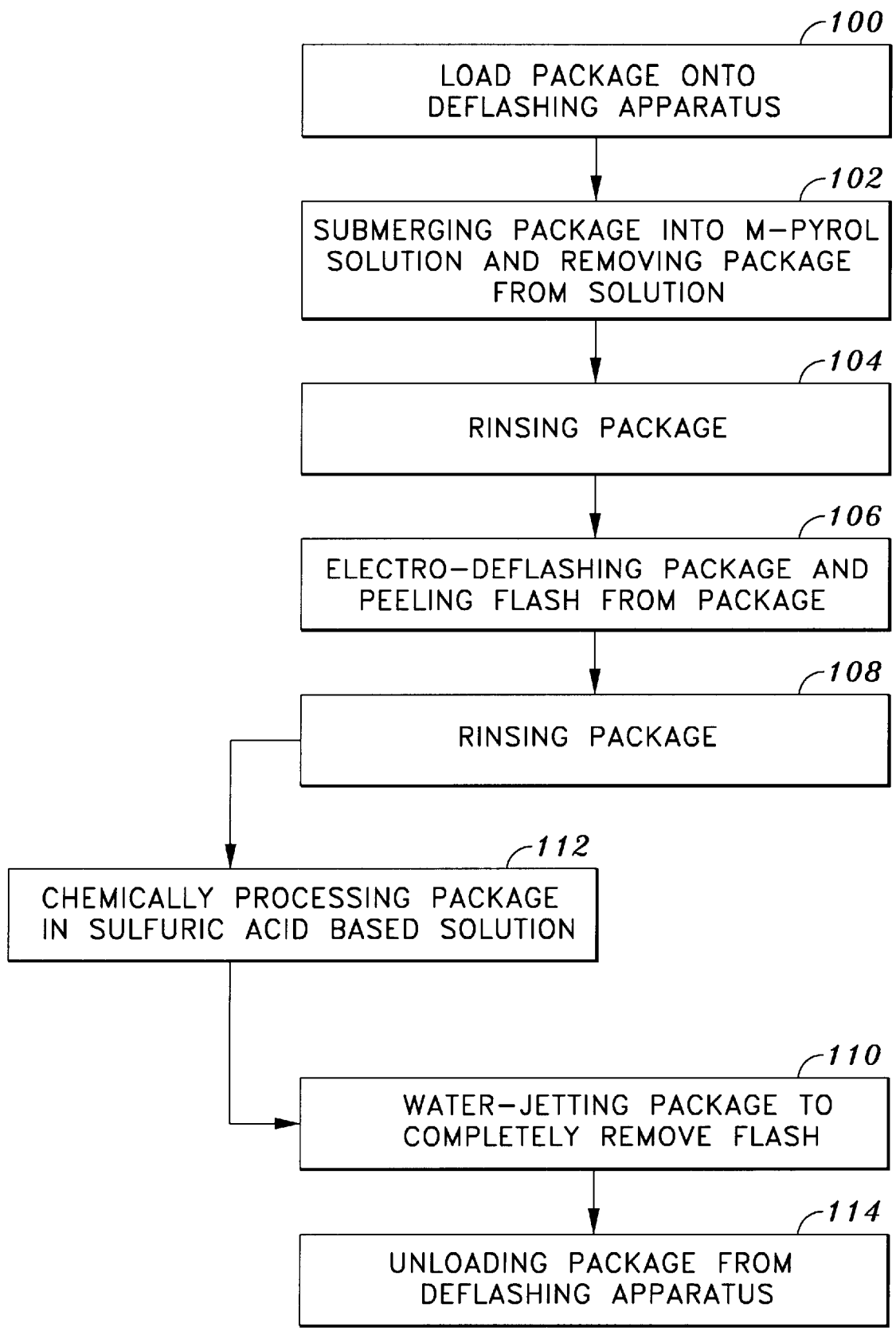
FIG. 20 is a flow chart describing an alternate process for removing flash and for restoring the original color of exposed metal surfaces.

Referring now to FIG. 20, it is noted that the method described in FIG. 20 is similar to that described in FIG. 19. Consequently, the method steps indicated by the boxes in FIGS. 19 and 20 that are the same, will retain the same numerical designation. It is noted that the method in FIG. 20 is the same as that described in FIG. 19 in boxes 100–108. The described methods diverge at the steps following box 108. Consequently, the step following 108 in FIG. 20 shall be labeled box 116. FIG. 18 therefore indicates that subsequent to rinsing the semiconductor package 10, as described in box 108, the semiconductor package 10 is subjected to a chemical process in a sulfuric acid based solution, as indicated in box 112. After the chemical processing of box 112, the flash is completely removed from semiconductor package 10 by a water jetting process, as indicated in box 110. Finally, after the flash is removed, the semiconductor package 10 is unloaded from the deflashing apparatus, as is indicated in box 114.

The following applications are all being filed on the same date as the present application and all are incorporated by reference as if wholly rewritten entirely herein, including any additional matter incorporated by reference therein:

| Application Number | Title of Application | First Named Inventor |
| --- | --- | --- |
| 09/687,787 | Thin and Heat Radiant Semiconductor Package and Method for Manufacturing | Jae Hun Ku |
| 09/687,331 | Leadframe for Semiconductor Package and Mold for Molding the Same | Young Suk Chung |
| 09/687,532 | Method for Making a Semiconductor Package Having Improved Defect Testing and Increased Production Yield | Tae Heon Lee |
| 09/687,876 | Near Chip Size Semiconductor Package | Sean Timothy Crowley |
| 09/687,536 | End Grid Array Semiconductor Package | Jae Hun Ku |
| 09/687,048 | Leadframe and Semiconductor Package with Improved Solder Joint Strength | Tae Heon Lee |
| 09/687,585 | Semiconductor Package Having Reduced Thickness | Tae Heon Lee |
| 09/687,541 | Semiconductor Package Leadframe Assembly and Method of Manufacture | Young Suk Chung |

It is thus believed that the operation and construction of the present invention will be apparent from the foregoing description of the preferred exemplary embodiments. It will be obvious to a person of ordinary skill in the art that various changes and modifications may be made herein without departing from the spirit and the scope of the invention.

What is claimed is:

1. A semiconductor package comprising:

a die pad, wherein said die pad is half-etched on an upper and lower surface of a perimeter of said die pad to increase a moisture path from an upper surface of the die pad to a lower surface of the die pad;

a semiconductor chip on said upper surface of said die pad, said semiconductor chip having a plurality of bonding pads on an upper surface of said semiconductor chip;

a plurality of leads having lateral and bottom surfaces, the plurality of leads surrounding said die pad and extending away from said die pad, said leads in electrical communication with said bonding pads of said semiconductor chip;

a plating layer disposed on the lateral surfaces of the plurality of leads, the plating layer functioning to improve solder joint strength and functioning as a connection surface when the plurality of leads are connected to a solder material on a bottom surface of the plurality of leads, such that the solder material moves from the bottom surface to the plating layer on the lateral surface of the plurality of leads; and at least one tie bar extending outwardly from at least one corner of said die pad.

2. The semiconductor package according to claim 1 wherein:

a plurality of bond wires are electrically connected between each of said bonding pads and a top surface of each of said leads.

3. The semiconductor package according to claim 1 further comprising:

encapsulant material that encapsulates said die pad, said outer portion, said leads, and said tie bars.

4. The semiconductor package according to claim 1 wherein:

at least one lead is coated with a silver coating on at least a portion of an upper surface of said lead.

5. The semiconductor package according to claim 1 wherein:

at least one lead is coated with a silver coating on at least a portion of an upper surface of said lead.

6. The semiconductor package according to claim 1 wherein:

said leads are coated on an exposed surface with a material selected from a group comprising: copper, gold, solder, tin, nickel or palladium.

7. The semiconductor package according to claim 1 further comprising a recognition mark visible on said semiconductor package.

8. The semiconductor package according to claim 7 wherein:

said recognition mark is present at a location selected from a group comprising: a side of said package body, a bottom surface of the package body, an exposed surface of said tie bars, and an exposed surface of the die pad.

9. The semiconductor package according to claim 7 wherein:

said recognition mark is of a type selected from the group of a notch, a protuberance, a printed designation and a painted designation.

10. The semiconductor package according to claim 1 wherein:

the semiconductor package has a chip side and a leadframe side; and further comprising a burr on the chip side of one of said plurality of leads resulting from singulation of the plurality of leads from a leadframe in an upward direction.

11. A semiconductor package comprising:

a die pad;

a semiconductor chip on an upper surface of said die pad, said semiconductor chip having a plurality of bonding pads on an upper surface of said semiconductor chip;

a plurality of leads that surround said die pad and extend away from said die pad, the plurality of leads having a respective lateral surface, said leads in electrical communication with said bonding pads of said semiconductor chip, wherein at least one of said leads is coated with a conductive material;

a plating layer disposed on the lateral surfaces of the plurality of leads, the plating layer functioning to improve solder joint strength and functioning as a connection surface when the plurality of leads are connected to a solder material on a bottom surface of the plurality of leads, such that the solder material moves from the bottom surface to the plating layer on the lateral surface of the plurality of leads; and at least one tie bar extending outwardly from at least one corner of said die pad.

12. The semiconductor package according to claim 11 wherein:

said die pad is half-etched on an upper and lower surface of a perimeter of said die pad.

13. The semiconductor package according to claim 11 wherein:

a plurality of bond wires are electrically connected between each of said bonding pads and a top surface of each of said leads.

14. The semiconductor package according to claim 13 wherein:

said die pad is half-etched on an upper and lower surface of a perimeter of said die pad.

15. The semiconductor package according to claim 11 further comprising:

encapsulant material that encapsulates said die pad, said outer portion, said leads, and said tie bars.

16. The semiconductor package according to claim 11 wherein:

said conductive material is a silver coating on at least a portion of an upper surface of said lead.

17. The semiconductor package according to claim 11 wherein:

said conductive material is a gold coating on at least a portion of an upper surface of said lead.

18. The semiconductor package according to claim 11 wherein:

said conductive coating is on an exposed surface of said lead, said conductive coating comprised of a material selected from a group comprising: copper, gold, solder, tin, nickel or palladium.

19. The semiconductor package according to claim 11 further comprising a recognition mark visible on said semiconductor package.

20. The semiconductor package according to claim 19 wherein:

said recognition mark is present at a location selected from a group comprising: a side of said package body, a bottom surface of the package body, an exposed surface of said tie bars, and an exposed surface of the die pad.

21. The semiconductor package according to claim 19 wherein:

said recognition mark is of a type selected from the group of a notch, a protuberance, a printed designation and a painted designation.

22. The semiconductor package according to claim 11 wherein:

the semiconductor package has a chip side and a leadframe side; and further comprising a burr on the chip side of one of said plurality of leads resulting from singulation of the plurality of leads from a leadframe in an upward direction.

23. A semiconductor package comprising:

a die pad;

a semiconductor chip on an upper surface of said die pad, said semiconductor chip having a plurality of bonding pads on an upper surface of said semiconductor chip;

a plurality of leads that surround said die pad and extend away from said die pad, the plurality of leads having a respective lateral surface, said leads in electrical communication with said bonding pads of said semiconductor chip;

a plating layer disposed on the lateral surfaces of the plurality of leads, the plating layer functioning to improve solder joint strength and functioning as a connection surface when the plurality of leads are connected to a solder material on a bottom surface of the plurality of leads, such that the solder material moves from the bottom surface to the plating layer on the lateral surface of the plurality of leads;

at least one tie bar extending outwardly from at least one corner of said die pad;

an encapsulant material that encapsulates said die pad, said outer portion, said leads, and said at least one tie bar; and a recognition mark visible on said semiconductor package.

24. The semiconductor package according to claim 23 wherein:

said die pad is half-etched on an upper and lower surface of a perimeter of said die pad to increase a moisture path from an upper surface of the die pad to a lower surface of the die pad.

25. The semiconductor package according to claim 23 wherein:

a plurality of bond wires are electrically connected between each of said bonding pads and a top surface of each of said leads.

26. The semiconductor package according to claim 23 wherein:

said die pad is half-etched on a location selected from a group comprising said upper surface and a lower surface.

27. The semiconductor package according to claim 23 wherein:

at least one lead is coated with a silver coating on at least a portion of an upper surface of said lead.

28. The semiconductor package according to claim 23 wherein:

at least one lead is coated with a gold coating on at least a portion of an upper surface of said lead.

29. The semiconductor package according to claim 23 wherein:

said leads are coated on an exposed surface with a material selected from a group comprising: copper, gold, solder, tin, nickel or palladium.

30. The semiconductor package according to claim 23 wherein:

said recognition mark is present at a location selected from a group comprising: a side of said package body, a bottom surface of the package body, an exposed surface of said tie bars, and an exposed surface of the die pad.

31. The semiconductor package according to claim 23 wherein:

said recognition mark is of a type selected from the group of a notch, a protuberance, a printed designation and a painted designation.

32. The semiconductor package according to claim 23 wherein:

the semiconductor package has a chip side and a leadframe side; and further comprising a burr on the chip side of one of said plurality of leads resulting from singulation of the plurality of leads from a leadframe in an upward direction.

33. A semiconductor package having a chip side and a leadframe side, said semiconductor package comprising:

a die pad;

a semiconductor chip on an upper surface of said die pad, said semiconductor chip having a plurality of bonding pads on an upper surface of said semiconductor chip;

a plurality of leads that surround said die pad and extend away from said die pad, the plurality of leads having a respective lateral surface, said leads in electrical communication with said bonding pads of said semiconductor chip;

a plating layer disposed on the lateral surfaces of the plurality of leads, the plating layer functioning to improve solder joint strength and functioning as a connection surface when the plurality of leads are connected to a solder material on a bottom surface of the plurality of leads, such that the solder material moves from the bottom surface to the plating layer on the lateral surface of the plurality of leads;

at least one tie bar extending outwardly from at least one corner of said die pad; and a burr on the chip side of one of said plurality of leads resulting from singulation of the plurality of leads from a leadframe in an upward direction.

34. The semiconductor package according to claim 33 wherein:

said die pad is half-etched on an upper and lower surface of a perimeter of said die pad to increase a moisture path from an upper surface of the die pad to a lower surface of the die pad.

35. The semiconductor package according to claim 33 wherein:

a plurality of bond wires are electrically connected between each of said bonding pads and a top surface of each of said leads.

36. The semiconductor package according to claim 33 wherein:

said die pad is half-etched on a location selected from the group comprising said upper surface and a lower surface.

37. The semiconductor package according to claim 33 further comprising:

encapsulant material that encapsulates said die pad, said outer portion, said leads, and said tie bars.

38. The semiconductor package according to claim 33 wherein:

at least one lead is coated with a silver coating on at least a portion of an upper surface of said lead.

39. The semiconductor package according to claim 33 wherein:

at least one lead is coated with a gold coating on at least a portion of an upper surface of said lead.

40. The semiconductor package according to claim 33 wherein:

said leads are coated on an exposed surface with a material selected from a group comprising: copper, gold, solder, tin, nickel or palladium.

41. The semiconductor package according to claim 33 further comprising a recognition mark visible on said semiconductor package.

42. The semiconductor package according to claim 41 wherein:

said recognition mark is present at a location selected from a group comprising: a side of said package body, a bottom surface of the package body, a side surface of said pad, an exposed surface of said tie bars, and an exposed surface of the die pad.

43. The semiconductor package according to claim 42 wherein:

said recognition mark is of a type selected from the group of a notch, a protuberance, a printed designation and a painted designation.

* * * * *